(12) United States Patent
Arrigotti et al.

(10) Patent No.: US 7,183,496 B2
(45) Date of Patent: *Feb. 27, 2007

(54) SOLDERED HEAT SINK ANCHOR AND METHOD OF USE

(75) Inventors: George Arrigotti, Portland, OR (US); Tom E. Pearson, Beaverton, OR (US); Raiyomand F. Aspandiar, Portland, OR (US); Christopher D. Combs, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/843,408

(22) Filed: May 11, 2004

(65) Prior Publication Data

US 2004/0207076 A1    Oct. 21, 2004

Related U.S. Application Data

(62) Division of application No. 09/964,812, filed on Sep. 28, 2001, now Pat. No. 6,734,371.

(51) Int. Cl.
*H05K 1/16* (2006.01)

(52) U.S. Cl. ............... 174/260; 174/262; 248/71

(58) Field of Classification Search ........... 174/250, 174/261, 260, 262, 266, 252, 138 G; 361/760, 361/719, 726, 707, 710; 248/71
See application file for complete search history.

(56) References Cited

U.S. PATENT DOCUMENTS

| | | | |
|---|---|---|---|
| 2,918,240 A * | 12/1959 | Wiegand | 248/71 |
| 5,115,375 A | 5/1992 | Garay et al. | 361/400 |
| 5,150,865 A * | 9/1992 | Miller | 248/71 |
| 5,734,556 A | 3/1998 | Saneinejad et al. | 361/719 |
| 5,881,800 A | 3/1999 | Chung | 165/80.3 |
| 5,917,701 A | 6/1999 | Solberg | 361/704 |
| 6,037,660 A | 3/2000 | Liu | 257/722 |
| 6,061,240 A | 5/2000 | Butterbaugh et al. | 361/704 |
| 6,075,699 A | 6/2000 | Rife | 361/704 |
| 6,181,559 B1 | 1/2001 | Seo | 361/704 |
| 6,195,880 B1 * | 3/2001 | Hinshaw et al. | 29/845 |
| 6,229,703 B1 | 5/2001 | Lee | 361/704 |

(Continued)

FOREIGN PATENT DOCUMENTS

EP        1020910 A2    7/2000

*Primary Examiner*—Ishwar (I. B.) Patel
(74) *Attorney, Agent, or Firm*—Schwegman, Lundberg, Woessner & Kluth, P.A.

(57) ABSTRACT

An anchoring mechanism and method are provided for securing a component to a printed circuit board. The anchoring mechanism may include a loop, a first leg extending from the loop, and a second leg extending from the loop. The first leg may mount through a first hole of the printed circuit board and include a compressible section to compress when inserted into the first hole and to expand after passing through the first hole. The compressible section of the first leg may support solder between the anchoring mechanism and the first hole. Likewise, the second leg may mount through a second hole of the printed circuit board and include a compressible section to compress when inserted into the second hole and to expand after passing through the second hole. The compressible section of the second leg may support solder between the anchoring mechanism and the second hole.

15 Claims, 8 Drawing Sheets

U.S. PATENT DOCUMENTS

| | | | |
|---|---|---|---|
| 6,246,584 B1 | 6/2001 | Lee et al. | 361/704 |
| 6,273,185 B1 | 8/2001 | Lin et al. | 165/185 |
| 6,273,319 B1 | 8/2001 | Ichikawa et al. | 228/102 |
| 6,273,327 B1 | 8/2001 | Murray, Jr. et al. | 228/245 |
| 6,284,981 B1 | 9/2001 | Hwang | 174/138 |
| 6,313,993 B1 | 11/2001 | Hinshaw et al. | 361/704 |
| 6,434,004 B1 | 8/2002 | Matteson | 361/704 |
| 6,492,202 B1 | 12/2002 | Lober et al. | 438/122 |
| 2002/0039285 A1 | 4/2002 | Hsieh et al. | 361/799 |

\* cited by examiner

SOLDERED HEAT SINK ANCHOR AND METHOD OF USE

RELATED APPLICATIONS

This application is a divisional of U.S. patent application Ser. No. 09/964,812, filed Sep. 28, 2001, now issued as U.S. Pat. No. 6,734,371, the entire disclosure of which is incorporated herein by reference.

FIELD

The present invention is directed to the field of printed circuit boards. More particularly, the present invention is directed to a heat sink anchor for use with a printed circuit board.

BACKGROUND

Integrated circuits (ICs) that cannot be adequately cooled by simple exposure of the package to ambient air inside the system may employ a mechanism to remove additional heat in order to operate properly and meet reliability lifetime requirements. One mechanism is to place a metal heat sink with large surface area onto the IC. This increases the surface area exposed to air and increases the amount of heat transferred from the IC, thereby keeping its temperature below the maximum allowable. In order to efficiently remove heat, the heat sink is held in firm contact with the IC, or in firm contact with a thermal interface material (such as tape or grease) that is in contact with the IC.

Various mechanisms for securing heat sinks include using thermally conductive adhesive tape, and applying an external force to clamp together the IC and the heat sink. The external force mechanisms press down on the heat sink. An opposing upward force can be applied in various ways, including pulling up (1) under the bottom of the IC itself, (2) under the IC's socket (if one is used), and (3) under the circuit board to which the IC is mounted (regardless of whether or not a socket is used).

Heat sink mass is a factor in determining which pull-up mechanism is used. Less massive heat sinks can be secured with tape or clamping mechanisms that pull up on the IC or its socket (if used). However, larger heat sinks may require much more clamping force than these mechanisms can provide. This is because more massive parts generate greater separation forces during vibration. Larger heat sinks required for higher power devices (such as high speed processors and chipset components) may use a mechanism that pulls up on the circuit board.

One mechanism of pulling up on the circuit board is to manually insert a through hole mount (THM) anchor into plated through holes (PTHs) in the circuit board, and allow its leads (or legs) to be wave soldered when the bottom of the board is passed over a solder wave to mechanically and electrically connect all the other THM components to the board. An example of a THM anchor design is a heavy wire design in an inverted horseshoe shape, with the wire leads (or tips) inserted into PTHs in the board. The curved part of the horseshoe serves as the anchor point to which the heat sink clamping apparatus can be connected or secured. The clamping apparatus applies force in order to keep the heat sink in firm contact with the IC under static conditions and under the greater-force dynamic conditions of vibration.

Unfortunately, the static and dynamic vibration-generated forces may cause the solder joint to creep, resulting in solder cracks and eventually the failure of the anchor, which causes failure of the clamping mechanism, loss of contact between the heat sink and the IC, and ultimately the failure of the IC, the board and the system.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto.

The following represents brief descriptions of the drawings in which like reference numerals represent like elements and wherein.

DETAILED DESCRIPTION

Figure 1:
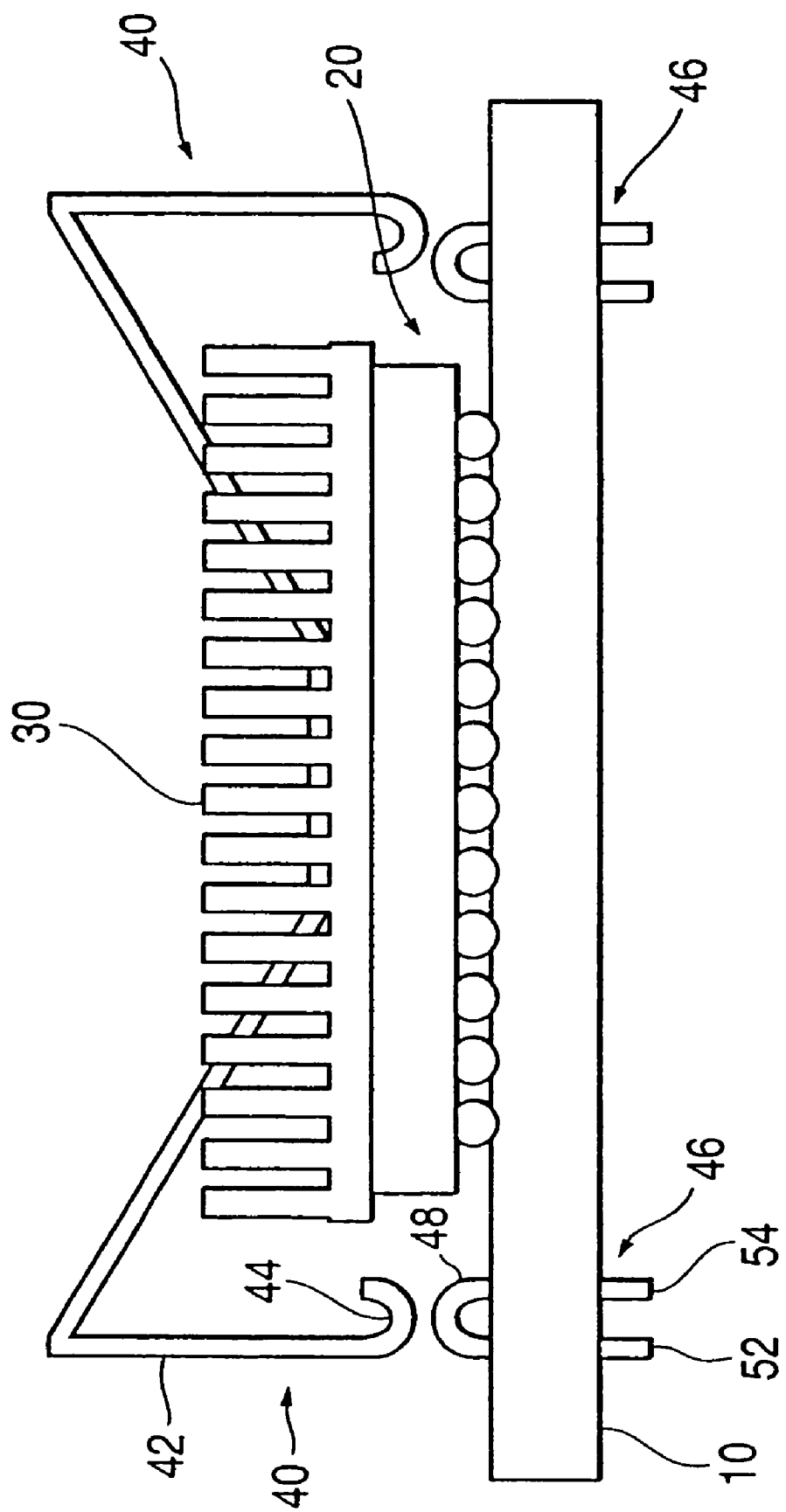
FIG. 1 illustrates a heat sink about to be attached by a heat sink clamping apparatus to through hole mount anchors.

In the following detailed description, like reference numerals and characters may be used to designate identical, corresponding or similar components in differing figure drawings. Further, in the detailed description to follow, example embodiments may be described, although the present invention is not limited to the same.

FIG. 1 illustrates one mechanism of coupling a heat sink 30 to a printed circuit board (PCB) 10. More specifically, FIG. 1 shows the heat sink 30 that is about to be attached by a clamping apparatus to through hole mount anchors. In this example, the heat sink 30 is provided on an IC 20 to remove heat from the IC 20. The heat sink 30 may be secured to the printed circuit board 10 by use of a clamping apparatus 40 and through hole anchors 46. Although FIG. 1 shows use of the clamping apparatus 40 and the through hole anchor 46 on more than one side of the heat sink 30, the following description will only relate to one side of the apparatus.

The clamping apparatus 40 may include a spring biased arm section 42 that is securely fastened to the heat sink 30 through any number of well known manners. The clamping apparatus 40 may include a hook section 44 shaped in the form of a hook that will couple to the through hole anchor 46. Rather than the hook section 44, the clamping apparatus 40 may include any type of mechanism to secure the spring biased arm section 42 to the through hole anchor 46. The through hole anchor 46 includes a loop section 48 to receive the hook section 44 (or other type of connection mechanism), a first leg 52 and a second leg 54. The first leg 52 is shown as passing through a first hole of the printed circuit board 10 and the second leg 52 is shown as passing through a second hole of the printed circuit board 10. Once the first leg 52 and the second leg 54 are provided through the respective holes of the printed circuit board 10, then the bottom of the printed circuit board 10 may be wave soldered (or applied in any other type of well known manners) so as to anchor the through hole anchor 46 to the printed circuit board 10. After the solder appropriately hardens, the hook section 44 may be looped around or connected to the loop section 48 so as to secure the clamping apparatus 40 to the through hole mount 46. This thereby secures the heat sink 30 to the printed circuit board 10.

Figure 2:
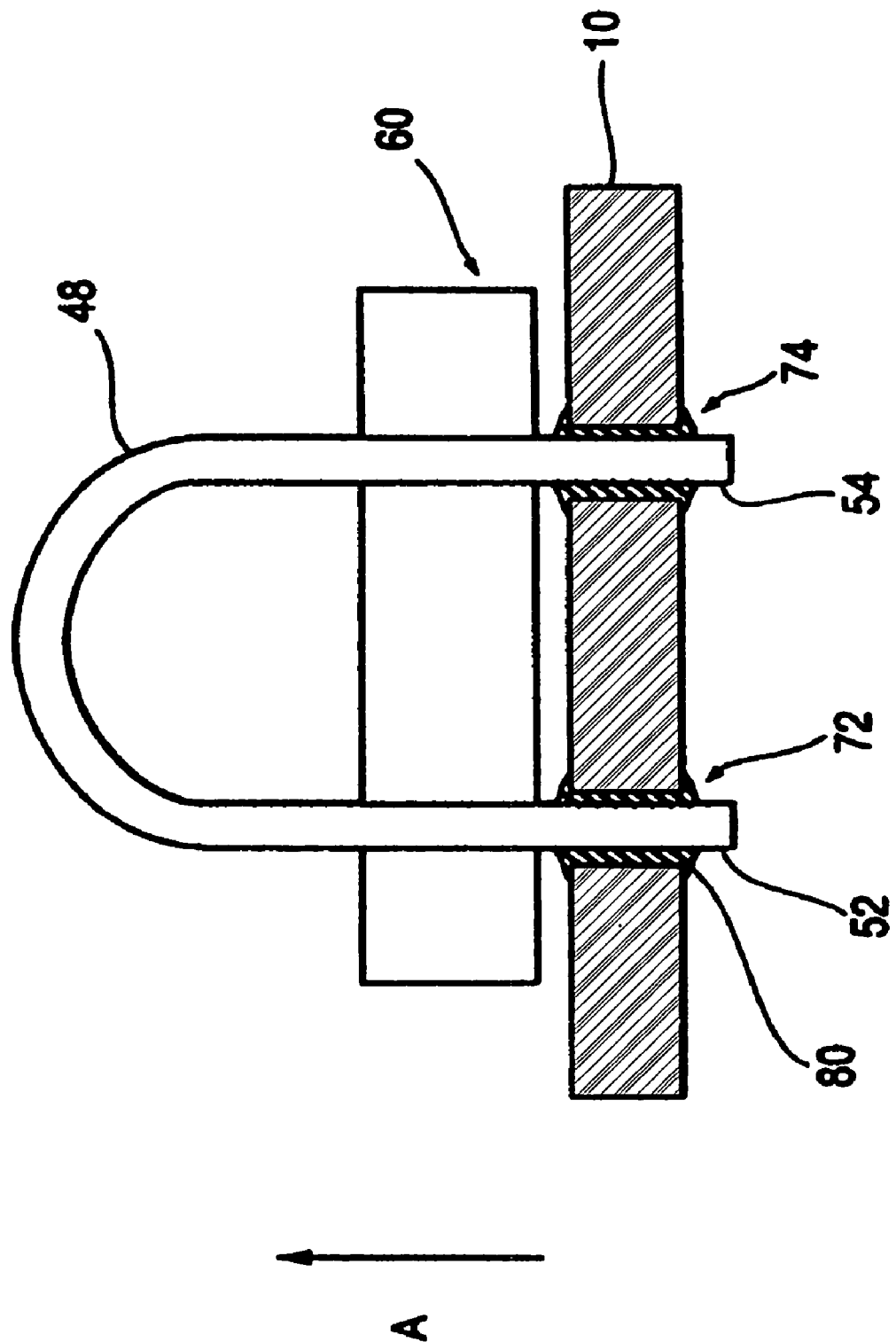
FIG. 2 illustrates a through hole mount anchor.

FIG. 2 shows the through hole mount anchor 46 shown in FIG. 1. More specifically, FIG. 2 shows the loop section 48, the first leg 52 and the second leg 54. The first leg 52 is shown as passing through a first hole 72 of the printed circuit board 10 and the second leg 54 is shown as passing through a second hole 74 of the printed circuit board 10. FIG. 2 further shows a base section 60 that also may be attached to the anchor 46 so as to prevent the loop section 48 from being pressed down too close to the printed circuit board 10. After the first leg 52 and the second leg 54 have passed through the first hole 72 and the second hole 74, respectively, then solder 80 may be provided within the first hole 72 and the second hole 74 by wave soldering or any other well known method of soldering components. However, one problem with this mechanism is that the first leg 52 and the second leg 54 may pull out from the holes 72 and 74 if sufficient upward force (such as arrow A) is applied over time and temperature.

Figure 3:
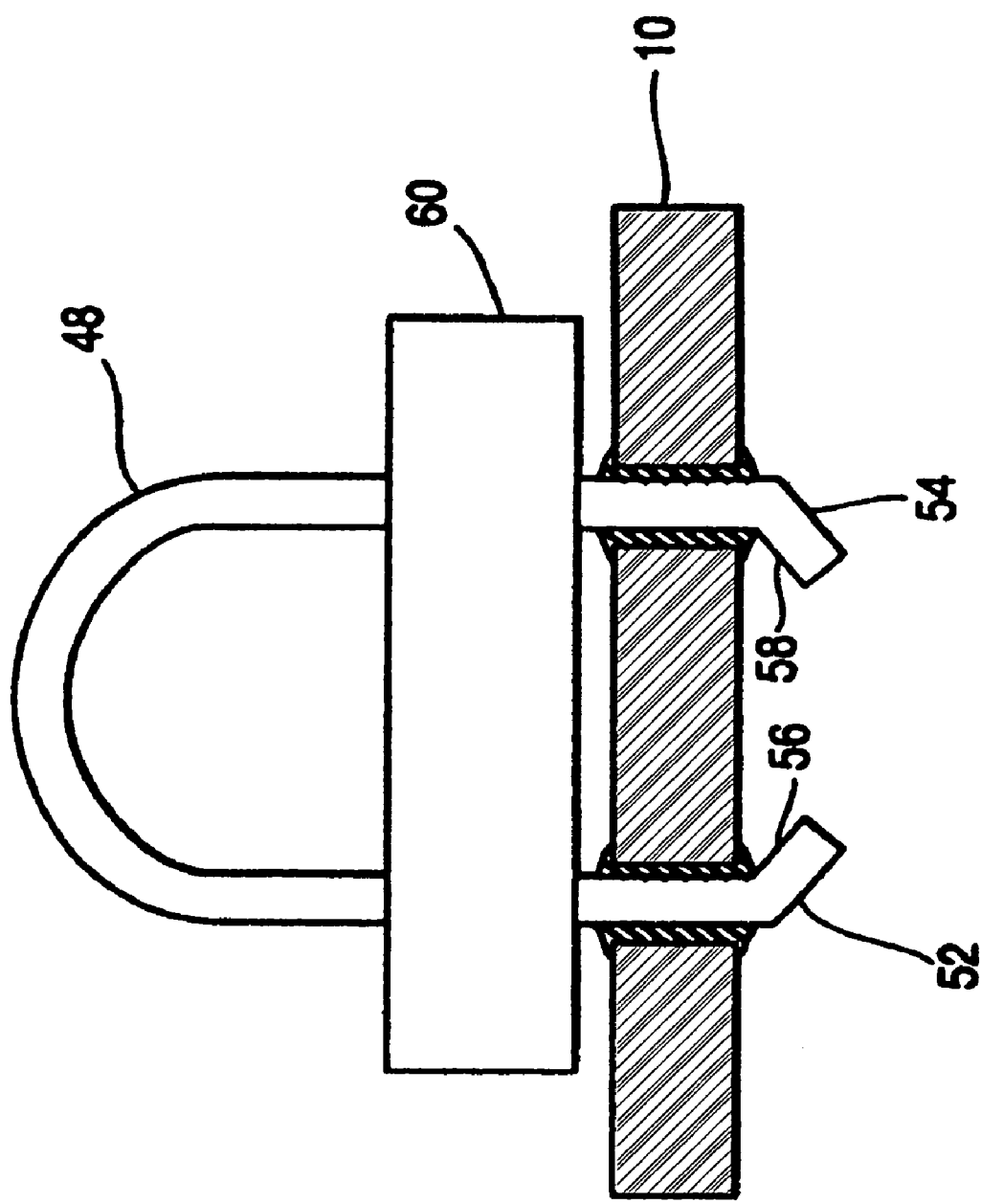
FIG. 3 illustrates a through hole mount anchor with bent legs after soldering.

In order to overcome this and/or other problems, FIG. 3 shows a modified anchor that is achieved by bending each of the legs 52 and 54 against a bottom surface of the printed circuit board 10. This may allow the anchor legs 52 and 54 to bear upward directly on the bottom of the circuit board 10 thereby reducing the upward force on the solder joints. More specifically, FIG. 3 shows a bent section 56 on the first leg 54 and a bent section 58 on the second leg 54. The bent sections 56 and 58 require additional tooling after the anchor 46 is inserted into the through holes 72, 74 on the printed circuit board 10 but before the circuit board 10 is wave soldered. This may require extra labor, extra tooling and extra workspace on the production line, which thereby increases the total assembly costs. The additional labor may be avoided by requiring personnel already working on the production line to perform the operation. However, this results in reduced line capacity, which also raises the total assembly costs.

Embodiments of the present invention may provide a through hole mount anchor that provides greater resistance to pullout when the board and the heat sink assembly are subjected to vibration or pullout force under temperature. While embodiments may be described with respect to securing a heat sink to a printed circuit board, the invention is not limited to these components. A greater resistance to pullout may be achieved by creating a taller wave soldered joint that increases the contact area between the anchor and solder. The amount of anti-pullout force that a THM anchor can provide is a function of the area of the interface between the anchor lead and the solder. Embodiments of the present invention create a much larger solder fillet and therefore a much larger interface area to provide greater resistance to pullout. The anchor may include a solder retention section (hereafter also called a compressible section) that retains a larger volume of solder than the anchor 46 shown in FIGS. 1–3. This solder retention section (on the tips of the legs) is an open design (such as a mesh) that compresses as the anchor legs are inserted into the through holes, then expands into a shape (such as a cone) that may capture additional solder during the wave soldering process. The solder retention section thereby provides extra anti-pullout force. Accordingly, embodiments of the present invention may allow a through mount anchor to resist greater pullout forces without requiring a secondary operation on the backside of the printed circuit board prior to wave soldering.

Figure 4:
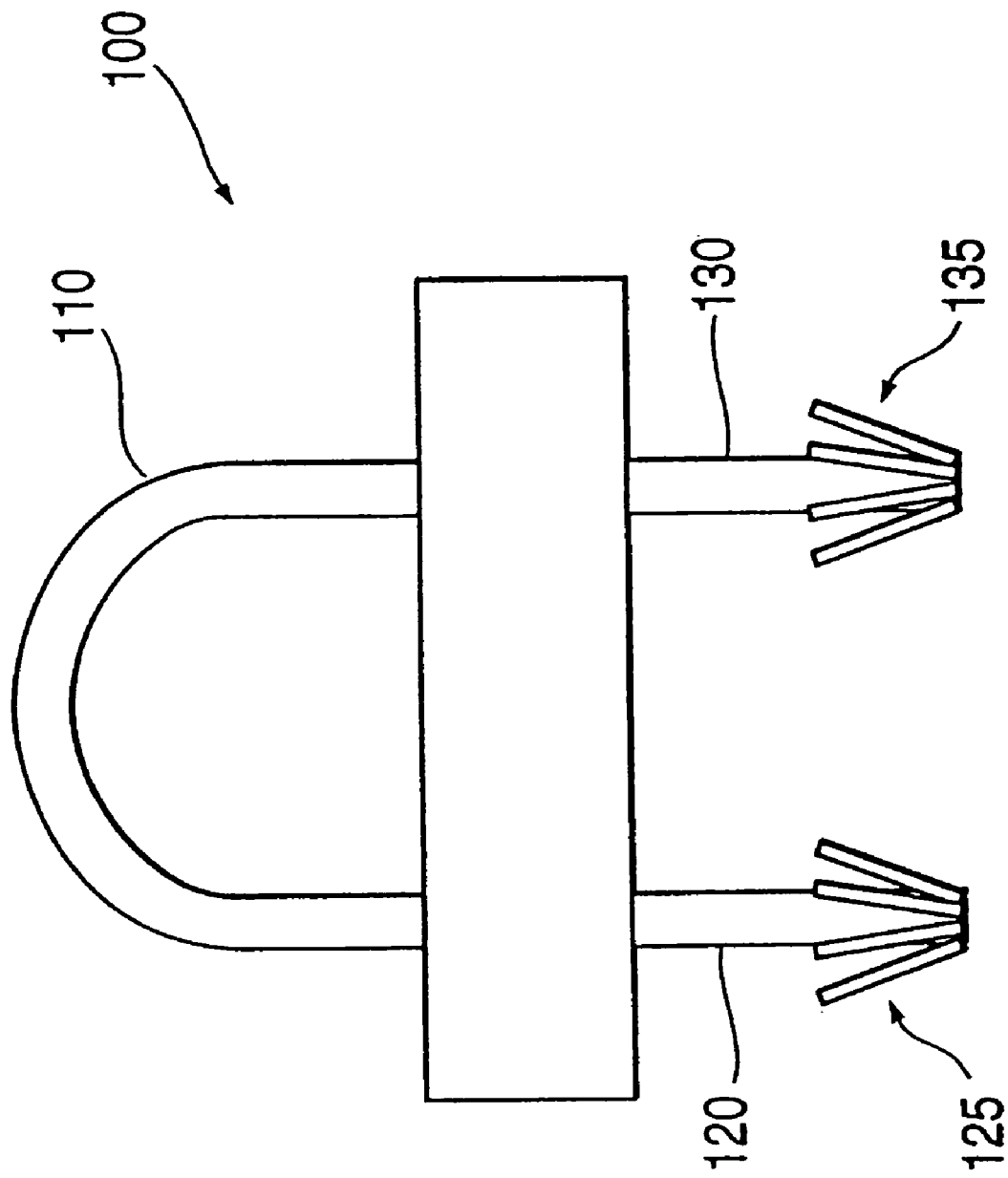
FIG. 4 illustrates a through hole mount anchor according to an example embodiment of the present invention.

FIG. 4 illustrates a through hole mount anchor according to an example embodiment of the present invention. Other embodiments and configurations of the through hole mount anchor are also within the scope of the present invention. More specifically, FIG. 4 shows an anchor 100 that includes a loop section 110, a first leg 120, cone-shaped barbs 125, a second leg 130 and cone-shaped barbs 135. The cone-shaped barbs 125 are provided at the end (or tip) of the first leg 120 opposite the loop section 110 and the cone-shaped barbs 135 are provided at the end (or tip) of the second leg 130 opposite the loop section 110. The cone-shape barbs 125, 135 provide and perform the following: (1) the cone-shaped barbs 125,135 compress as they are inserted into through holes of the printed circuit board; (2) the cone-shaped barbs 125, 135 expand after passing through the through holes; and (3) the cone-shaped barbs 125, 135 capture and support solder between the tip of the barbs and the bottom surface of the printed circuit board. The anchor 100 (including the cone-shaped barbs 125, 135) may be made of a solderable material such as any type of well-known metal. The cone-shaped barbs 125, 135 may be integrally formed with the loop section 110, the first leg 120 and the second leg 130 or the cone-shaped barbs 125, 135 may be separately formed and subsequently attached to tips of the first leg 120 and the second leg 130. When uncompressed, the cone-shape barbs 125 and 135 expand to a diameter wider than the expected through holes. The cone-shaped barbs 125 and 135 compress to a diameter just narrower than the through holes when inserted into the through holes.

Figure 5:
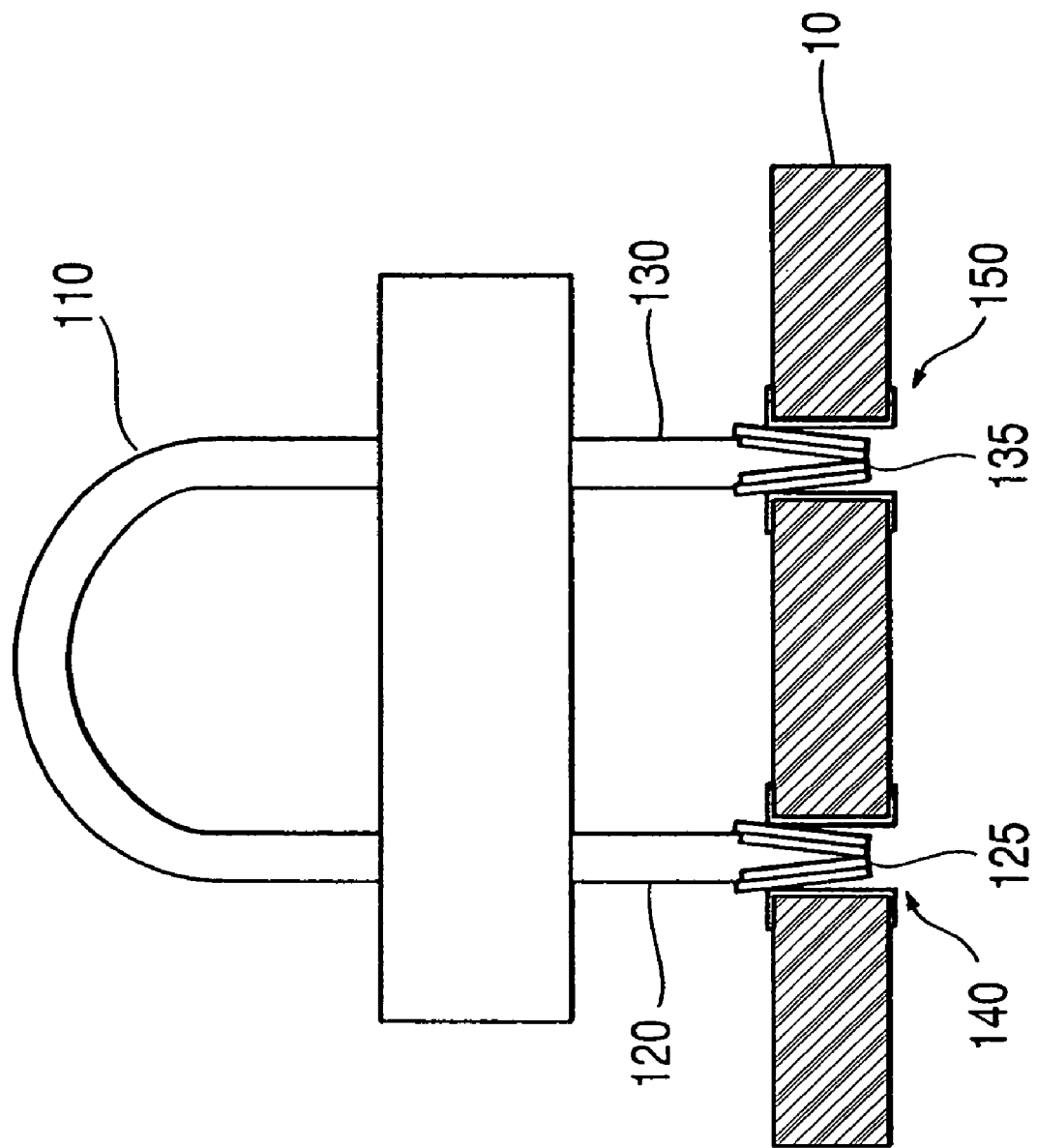
FIG. 5 illustrates the through hole mount anchor of FIG. 4 during insertion into a printed circuit board according to an example embodiment of the present invention.

FIG. 5 illustrates the through hole mount anchor 100 as the anchor 100 is being inserted through the printed circuit board 10. FIG. 5 clearly shows the cone-shaped barbs 125 being compressed by walls of a first through hole 140 while being inserted into the first through hole 140 and shows the cone-shaped barbs 135 being compressed by walls of a second through hole 150 while being inserted into the second through hole 150.

Figure 6:
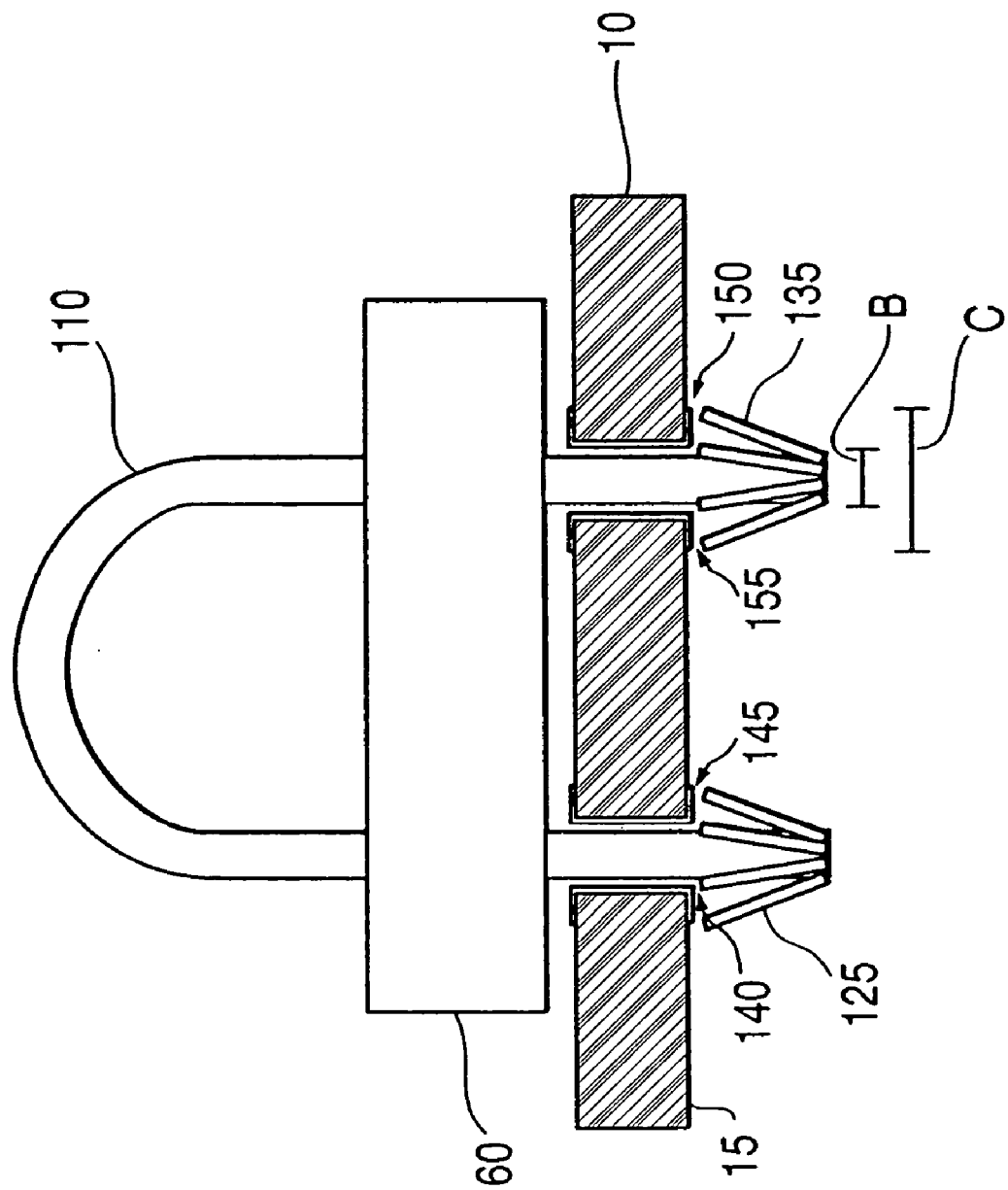
FIG. 6 illustrates the through hole mount anchor of FIG. 4 after insertion into the printed circuit board according to an example embodiment of the present invention.

After passing through the holes, the cone-shape barbs 125, 135 expand to their uncompressed state in which they have a greater width than a diameter of the expected through holes. FIG. 6 shows the cone-shaped barbs 125 and 135 expanded to a width greater than the diameter of the through holes 140 and 150, respectively. More specifically, a distance B represents a diameter of the first through hole 140 and a distance C represents a diameter of the barbs in an uncompressed state. The first leg 52 and the second leg 54 as shown are extending below a bottom face 15 of the printed circuit board 10 such that a space 145 is provided between the cone-shaped barbs 125 and the bottom face 15 of the printed circuit board 10 and a space 155 is provided between the cone-shaped barbs 135 and the bottom face 15 of the printed circuit board. The spaces 145 and 155 may subsequently get filled with solder so as to provide a greater length of the solder-to-lead interface. This additional solder provides an extra anti-pullout force as compared to disadvantageous arrangements. The distance that the legs 52 and 54 extend below the face 15 surface of the printed circuit board 10 may be based on the position that the base section 60 is secured to the legs 52, 54.

Figure 7:
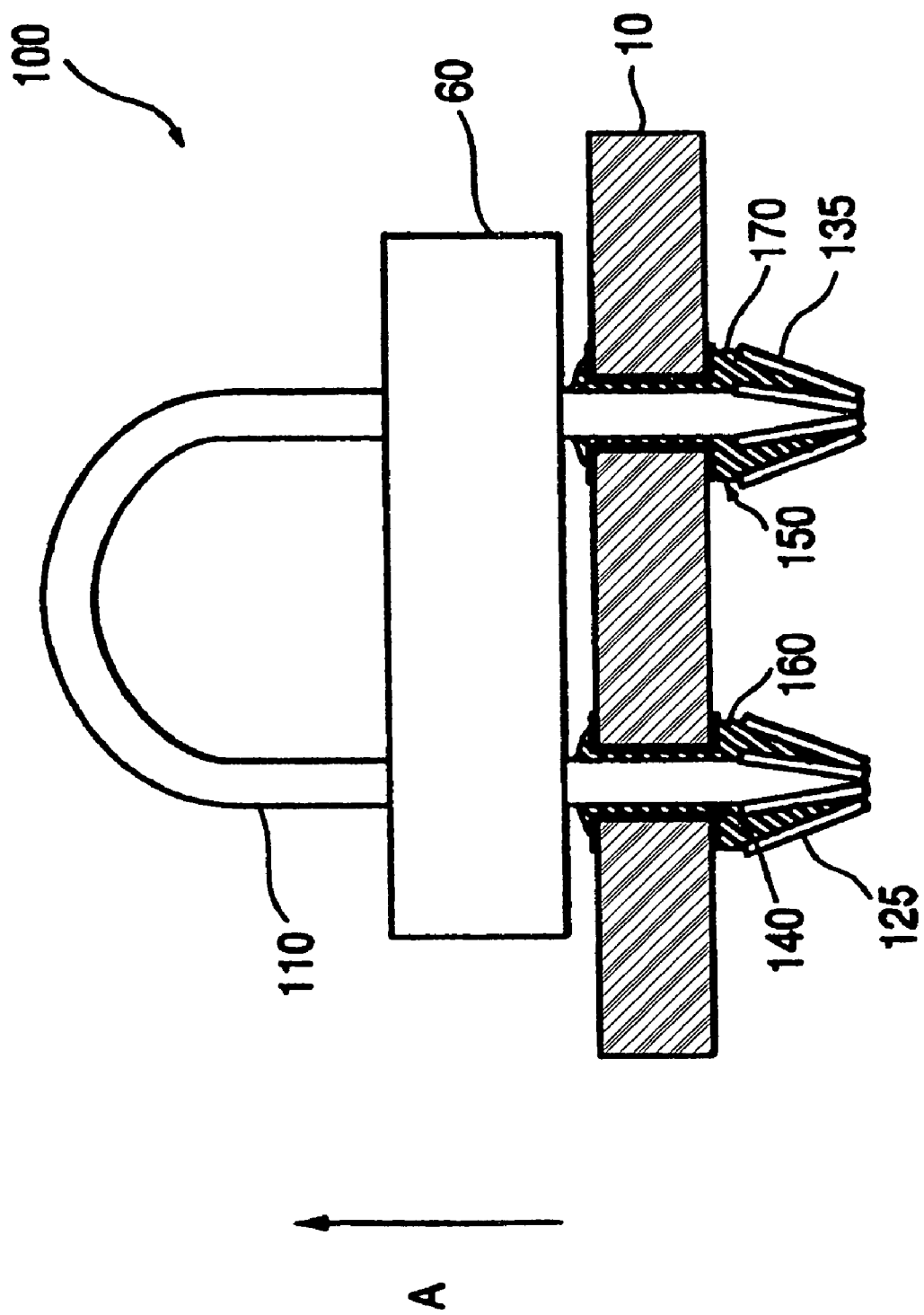
FIG. 7 illustrates the through hole mount anchor of FIG. 4 after wave soldering according to an example embodiment of the present invention.

FIG. 7 illustrates the through mount anchor 100 after being wave soldered according to an example embodiment of the present invention. Other types of soldering are also within the scope of the present invention. More specifically, FIG. 7 shows solder 160 provided between the cone-shaped barbs 125 and the bottom face 15 of the printed circuit board 10 (as well as in the first through hole 140). FIG. 7 also shows solder 170 provided between the cone-shape barbs 135 and the bottom face 15 of the printed circuit board 10 (as well as in the second through hole 150). Molten solder from a wave soldering process may wick up between the legs 52 and 54 and the walls of the through holes 140 and 150. Some of the solder may form topside fillets on the top of the printed circuit board 10. The solder 160, 170 provided between the bottom face 15 of the printed circuit board 10 and the cone-shape barbs 125, 135 provides extra anti-pullout force should the anchor mount be subjected to an upward force (shown as arrow A). The cone-shape barbs 125 and 135 catch and retain additional solder so as to provide more strength to the anchor 100. This thereby provides a much larger solder-anchor interface (as measured from the bottom of the base section 60 to the tip of the cone-shape barbs 125 and/or 135).

Figure 8:
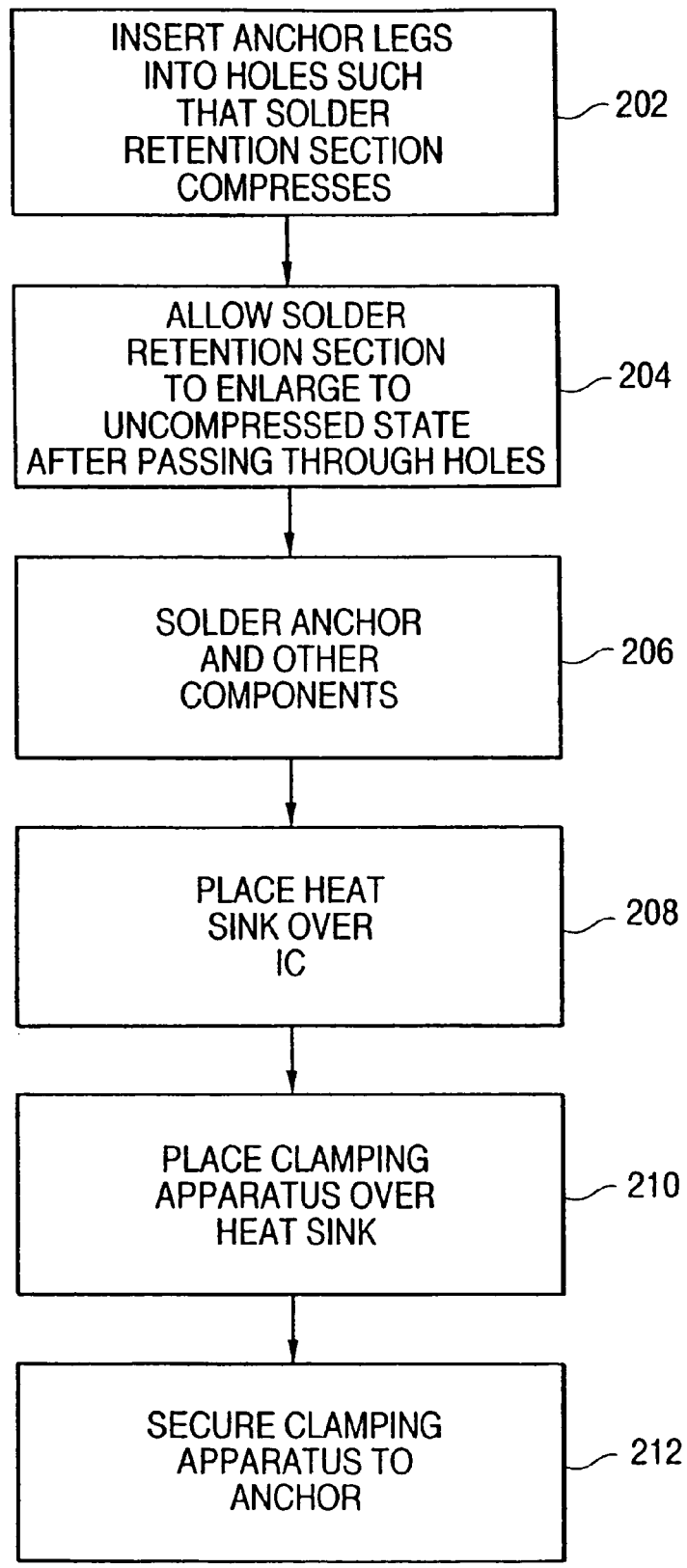
FIG. 8 is a flowchart showing operations for securing a component to a printed circuit board according to an example embodiment of the present invention.

FIG. 8 is a flowchart 200 showing operations for securing a component (such as an integrated circuit) to a printed circuit board according to an example embodiment of the present invention. Other embodiments, configurations and orders of operations are also within the scope of the present invention. More specifically, in block 202, an anchor may be inserted into a printed circuit board such that a solder retention section (such as a cone-shaped tip) compresses as it passes through a hole in the printed circuit board. In block 204, the solder retention section enlarges to an uncompressed state after passing through the hole of the printed circuit board. In block 206, the anchor and other components may be wave soldered so as to secure them to the printed circuit board. In block 208, a heat sink may be placed over the integrated circuit and in block 210 the clamping apparatus may be placed on the heat sink. Then, in block 212 the clamping apparatus may be secured to the anchor in block 212.

Accordingly, embodiments of the present invention may provide a barb-shaped tip at the end of a through hole mount anchor lead (FIG. 4). The barb shaped tip may be designed to compress slightly as the anchor is inserted from one side of the board (FIG. 5) and then to expand slightly when it exits the other side of the board (FIG. 6). The barb may be designed to attract and retain a significant amount of solder when the board is wave soldered (FIG. 7). An unmodified tip (FIG. 2) may retain a normal amount of solder in the shape of a fillet whereas the cone-shaped barbs described with respect to embodiments of the present invention may produce a taller, wider, cone-shaped solder deposit. This may result in a solder-to-anchor-lead interface with a larger surface area. The interface surface area may equal a circumference of the anchor lead times a distance from the top of the top fillet (on the top of the printed circuit board 10) to the bottom of the bottom fillet. This larger surface area, when compared to the unmodified tip, may result in greater pullout force under vibration and temperature.

The cone-shaped barb tip may be constructed in any number of ways including as an integral part of the legs or as a separate part that is attached to the legs. The cone-shaped barb tip may be produced by cutting and folding back portions of the leg material. The barbs may be constructed from a stamped disk of spring contact material, such as beryllium copper. The center of the disk may be attached to the lead tip, and the remainder of the disk may be formed into the fingers of the barb.

Other shapes and constructions of the tip are also within the scope of the present invention. That is, embodiments of the present invention are also applicable to any tip that compresses when inserted into a hole, expands after passing through the hole and retains solder in a manner similar to that described above so as to retain a greater volume of solder.

Accordingly, embodiments of the present invention may provide an anchoring mechanism to mount to a printed circuit board. The anchoring mechanism may include a loop, a first leg extending from the loop and a second leg extending from the leg. The first leg may mount through a first hole of the printed circuit board and include a compressible section (or solder retention section) to compress when inserted into the first hole and to expand after passing through the first hole. The compressible section may support solder between the anchoring mechanism and the first hole. The second leg may mount through a second hole of the printed circuit board and include a compressible section (or solder retention section) to compress when inserted into the second hole and to expand after passing through the second hole. The compressible section may support solder between the anchoring mechanism and the second hole.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. An anchoring mechanism, said anchoring mechanism comprising a loop, a first leg extending from said loop, said first leg includes a compressible section to compress and to expand, said compressible section supporting solder between said compressible section and said loop.

2. The anchoring mechanism of claim 1, further comprising a second leg extending from said loop, said second leg includes a compressible section to compress and to expand, said compressible section supporting solder between said compressible section and said loop.

3. The anchoring mechanism of claim 1, wherein said compressible section comprises cone shaped barbs provided on an end of said first leg.

4. The anchoring mechanism of claim 3, wherein said cone shaped barbs comprise a plurality of barb fingers each extending from a tip of said first leg toward said loop.

5. The anchoring mechanism of claim 1, wherein said compressible section expands to a distance greater than a diameter of said first leg.

6. The anchoring mechanism of claim 1, wherein said compressible section comprises a plurality of barb fingers each extending from a tip of said first leg toward said loop.

7. The anchoring mechanism of claim 1, wherein said compressible section comprises a plurality of barb fingers each having a respective first end and a respective second end, each first end coupled to a tip of said first leg and extending toward said loop, a space being provided between each second end and said loop, and solder being provided between each of said fingers and said loop.

8. The anchoring mechanism of claim 1, wherein said compressible section comprises a plurality of barb fingers each having a respective first end and a respective second end, each first end coupled to said first leg and extending toward said loop, and solder being provided between each of said second ends and said loop.

9. An anchoring mechanism comprising a loop, a first leg extending from said loop, and a second leg extending from said loop, said first leg including a first solder retention section on a tip of said first leg supporting solder and a second solder retention section on a tip of said second leg supporting solder.

10. The anchoring mechanism of claim 9, wherein said first solder retention section compresses and expands, said first solder retention section to support solder between said first solder retention section and said loop.

11. The anchoring mechanism of claim 9, wherein said first solder retention section comprises cone-shaped barbs.

12. The anchoring mechanism of claim 11, wherein said cone-shaped barbs comprise a plurality of barb fingers each extending from a tip of said first leg.

13. The anchoring mechanism of claim 9, wherein said first solder retention section comprises a plurality of barb fingers each extending from the tip of said first leg.

14. The anchoring mechanism of claim 9, wherein said first solder retention section comprises a plurality of barb fingers each having a respective first end and a respective second end, each first end coupled to the tip of said first leg and extending toward the loop, and solder being provided between each of said fingers and the loop.

15. The anchoring mechanism of claim 9, wherein said first solder retention section comprises a plurality of barb fingers each having a respective first end and a respective second end, each first end coupled to said first leg and extending toward the loop, and solder being provided between each of said second ends and said loop.

* * * * *